United States Patent
Zhang et al.

(10) Patent No.: US 7,233,612 B1
(45) Date of Patent: Jun. 19, 2007

(54) WIRELESS COMMUNICATION DEINTERLEAVER USING MULTI-PHASE LOGIC AND CASCADED DEINTERLEAVING

(75) Inventors: Liping Zhang, Los Angeles, CA (US); Peter Chan, Fremont, CA (US); Howard Hicks, San Francisco, CA (US); Chih (Rex) Hsueh, Cupertino, CA (US); Chien-Meen Hwang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 939 days.

(21) Appl. No.: 10/367,777

(22) Filed: Feb. 19, 2003

(51) Int. Cl.
  *H04B 1/00* (2006.01)
(52) U.S. Cl. ............ 375/130; 375/222; 375/340; 375/341; 375/262; 714/752; 714/763; 714/756; 714/762; 711/5; 711/157
(58) Field of Classification Search ........ 375/220, 375/222, 149, 150; 714/746, 752, 755, 756, 714/761, 762, 787, 788, 784
See application file for complete search history.

(56) References Cited

U.S. PATENT DOCUMENTS

| 5,862,189 | A  | * | 1/1999 | Huisken et al. ......... 375/341 |
| 6,415,413 | B1 | * | 7/2002 | Pan et al. ............... 714/784 |
| 6,986,081 | B1 | * | 1/2006 | Furutani ............... 714/701 |
| 6,993,702 | B2 | * | 1/2006 | Lee et al. .............. 714/790 |
| 2004/0015665 | A1 | * | 1/2004 | Dagan ................. 711/158 |

OTHER PUBLICATIONS

IEEE Std. 802.11a-1999, "Part 11: Wireless LAN Medium Access Control (MAC) and Physical Layer (PHY) specifications: High-speed Physical Layer in the 5 GHZ Band", L.AN/MAN Standards Committee of the IEEE Computer Society, IEEE-SA Standards Board, Approved Sep. 16, 1999, New York, USA.

* cited by examiner

*Primary Examiner*—Chieh M. Fan
*Assistant Examiner*—Sui M. Lee
(74) *Attorney, Agent, or Firm*—Manelli Denison & Selter PLLC; Leon R. Turkevich

(57) ABSTRACT

A deinterleaver module in an OFDM wireless transceiver includes partitioned memory banks for storage of code word fragments from an interleaved data stream, each code word fragment associated with a prescribed subcarrier frequency. Each code word fragment includes a prescribed number of code word bits based on a prescribed modulation of the interleaved data stream, and the code word bits for each code word fragment are written into respective selected locations of the corresponding memory bank based on the prescribed modulation and the corresponding prescribed subcarrier frequency. Write enable signals, bit selection signals, and address signals for each of the code word bits are generated based on applying logical operands to a cascaded sequence of successively delayed signals synchronous with a local clock signal. The deinterleaver module outputs deinterleaved data from the memory banks based on parallel output of the respective stored code word bits from a selected address of the memory banks.

15 Claims, 13 Drawing Sheets

WIRELESS COMMUNICATION DEINTERLEAVER USING MULTI-PHASE LOGIC AND CASCADED DEINTERLEAVING

BACKGROUND OF THE INVENTION

1. Field of the Invention

The present invention relates to a deinterleaver module of a wireless receiver, for example a IEEE 802.11a based Orthogonal Frequency Division Multiplexing (OFDM) receiver.

2. Background Art

Local area networks historically have used a network cable or other media to link stations on a network. Newer wireless technologies are being developed to utilize OFDM modulation techniques for wireless local area networking applications, including wireless LANs (i.e., wireless infrastructures having fixed access points), mobile ad hoc networks, etc. In particular, the IEEE Standard 802.11a, entitled "Wireless LAN Medium Access Control (MAC) and Physical Layer (PHY) specifications: High-speed Physical Layer in the 5 GHz Band", specifies an OFDM PHY for a wireless LAN with data payload communication capabilities of up to 54 Mbps. The IEEE 802.11a Standard specifies a PHY system that uses fifty-two (52) subcarrier frequencies that are modulated using binary or quadrature phase shift keying (BPSK/QPSK), 16-quadrature amplitude modulation (QAM), or 64-QAM.

Hence, the IEEE Standard 802.11a specifies an OFDM PHY that provides high speed wireless data transmission with multiple techniques for minimizing data errors.

A particular concern in implementing an IEEE 802.11 based OFDM PHY in hardware involves providing a cost-effective, compact device the can be implemented in smaller wireless devices. Hence, implementation concerns typically involve cost, device size, and device complexity.

For example, the IEEE Standard 802.11a specifies that interleaving is performed on the transmit data stream using a two-step permutation to improve bit error rate performance in the presence of frequency-selective channel fading. In particular, adjacent coded bits are mapped in the first permutation onto non-adjacent subcarrier frequencies (i.e., "tones") to prevent frequency-selective fading; depending on the modulation scheme used by the transmitter (e.g., BPSQ, QPSK, 16-QAM, or 64-QAM), adjacent coded bits also may be mapped in the second permutation onto alternately less and more significant bits in the constellation map (I+jQ) to reduce long runs of low reliability (i.e., least significant bit) values.

Hence, an OFDM PHY receiver configured for receiving IEEE 802.11a based wireless signals requires a deinterleaver to perform the two inverse permutations applied to the code words prior to transmission. However, the block size for each interleaving permutation is variable, based on the modulation scheme utilized by the transmitter (e.g., BPSK, QPSK, 16-QAM, or 64-QAM). Moreover, the mere storage of the serial data stream into successive memory locations of a random memory, followed by two-stage manipulation of the serial data stream following storage thereof to recover the deinterleaved data, may create substantial latency delays within the deinterleaver due to the processing overhead and the substantial memory read/write access operations necessary to deinterleave the received serial stream.

In addition, inefficient implementation of the OFDM PHY receiver may result in increased cost. For example, an inefficient implementation of the OFDM PHY may rely on a large read only memory (ROM) or inefficient state machines for deinterleaving operations such as memory addressing or deinterleaving sequence generation, increasing the size and cost of the device.

SUMMARY OF THE INVENTION

There is a need for an arrangement that enables a wireless transceiver host to perform deinterleaving of a received serial stream in an efficient and economical manner.

There also is a need for an arrangement that enables a wireless transceiver host to perform deinterleaving of a received serial stream with minimal latency.

These and other needs are attained by the present invention, where a deinterleaver module in an OFDM wireless transceiver includes partitioned memory banks for storage of code word fragments from an interleaved data stream, each code word fragment associated with a prescribed subcarrier frequency. Each code word fragment includes a prescribed number of code word bits based on a prescribed modulation of the interleaved data stream, and the code word bits for each code word fragment are written into respective selected locations of the corresponding memory bank based on the prescribed modulation and the corresponding prescribed subcarrier frequency. Write enable signals, bit selection signals, and address signals for each of the code word bits are generated based on applying logical operands to a cascaded sequence of successively delayed signals synchronous with a local clock signal. The deinterleaver module outputs deinterleaved data from the memory banks based on parallel output of the respective stored code word bits from a selected address of the memory banks.

Hence, deinterleaving operations can be efficiently implemented based on implementing serial-input/parallel output write/read operations within partitioned memory banks.

One aspect of the present invention provides a method in a deinterleaver module for deinterleaving interleaved data into deinterleaved data. The method includes generating a write enable signal for writing a code word fragment into one of a group of partitioned memory banks. The write enable signal has a period based on a prescribed maximum number of code word bits for the code word fragment relative to a prescribed clock, and an enable duration having a number of clock cycles corresponding to a prescribed number of the code word bits in the code word fragment based on a prescribed modulation of the interleaved data. The method also includes generating an address signal based on the prescribed modulation and a selected offset, including selectively incrementing, based on the prescribed modulation, the address signal by the selected offset each clock signal concurrent with the enable duration. The method also includes generating successively delayed copies of the write enable signal and the address signal for others of the group of partitioned memory banks, and storing a first group of the code word fragments into the respective group of partitioned memory banks, by supplying to the respective partitioned memory banks the address and write enable signals and the successively delayed copies thereof. Each code word fragment is associated with a corresponding prescribed subcarrier frequency and has the number of code word bits, and the storing includes writing the code word bits for each code word fragment into respective selected locations of the corresponding memory bank based on the corresponding address signal and the corresponding write enable signal.

Another aspect of the present invention provides a deinterleaver module including a group of partitioned memory banks, a write logic module, and an output module. The group of partitioned memory banks is configured for storing interleaved data as a respective group of successive code word fragments, each code word fragment associated with a prescribed subcarrier frequency and having a prescribed number of code word bits based on a prescribed modulation of the interleaved data, each memory bank configured for storing a selected bit of a corresponding received code word fragment at a corresponding selected location. The write logic module is configured for storing, for each memory bank, the code word bits for each corresponding code word fragment into the respective selected locations based on the prescribed modulation and the corresponding prescribed subcarrier frequency. The write logic module includes a data selection logic module configured for generating bit selection signals for storage of the code word bits according to selected bit deinterleaving sequences, based on at least selected ones of a plurality of successively delayed copies of a write enable signal component. The write logic module also includes a multi-phase write enable logic generator configured for generating the successively delayed copies of the write enable signal, the write enable signal having a period based on a prescribed maximum number of code word bits for the code word fragment relative to a prescribed clock and an enable duration having a number of clock cycles corresponding to a prescribed number of the code word bits in the code word fragment based on a prescribed modulation of the interleaved data. The output module is configured for outputting deinterleaved data from the partitioned memory banks by retrieving, in parallel, code word bits stored at a corresponding selected address for the memory banks.

Additional advantages and novel features of the invention will be set forth in part in the description which follows and in part will become apparent to those skilled in the art upon examination of the following or may be learned by practice of the invention. The advantages of the present invention may be realized and attained by means of instrumentalities and combinations particularly pointed in the appended claims.

BRIEF DESCRIPTION OF THE DRAWINGS

Reference is made to the attached drawings, wherein elements having the same reference numeral designations represent like elements throughout and wherein.

BEST MODE FOR CARRYING OUT THE INVENTION

The disclosed embodiment will be described with reference to an overview of an IEEE 802.11 OFDM transceiver, followed by a detailed description of the deinterleaver implemented according to an embodiment of the present invention.

Receiver Architecture Overview

Figure 1:
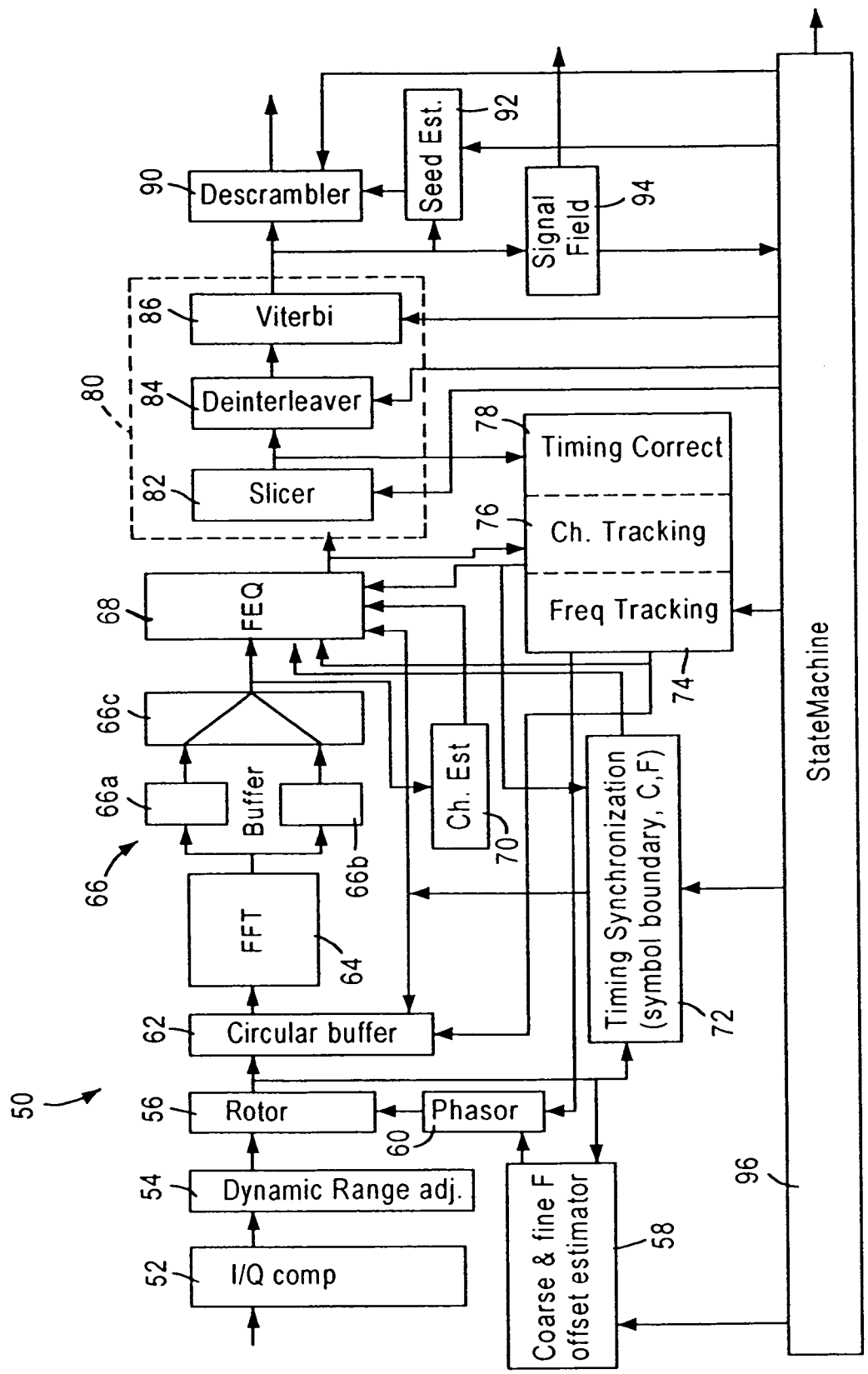
FIG. 1 is a diagram illustrating a receiver module of an IEEE 802.11 OFDM transceiver having a deinterleaver implemented according to an embodiment of the present invention.

FIG. 1 is a diagram illustrating an architecture of a receiver module 50 of an IEEE 802.11 Orthogonal Frequency Division Multiplexing (OFDM) transceiver, according to an embodiment of the present invention. The receiver module 50, implemented as a digital circuit, includes an I/Q mismatch compensation module 52 that receives detected wireless signal samples (in digital form) from an R/F front end, for example a receiver amplifier. The detected wireless signal samples include an I component and Q component: these I and Q components, which ideally should be orthogonal to each other and have a uniform relative gain, may in fact have a non-orthogonal phase difference (i.e., other than 90 degrees) and have an unequal gain. Hence, the I/Q mismatch compensation module is configured for compensating the mismatched I/Q components to generate compensated signal samples having matched I/Q components with orthogonal phase difference and a uniform relative gain.

The receiver module 50 also includes a dynamic range adjustment module 54. The dynamic range adjustment module 54 is configured for adjusting the gain of the compensated signal samples to a prescribed dynamic range for optimized signal processing, thereby outputting adjusted signal samples according to the prescribed dynamic range.

The rotor circuit 56 is configured for compensating between a local receiver carrier frequency (i.e., local oscillator) and the remote transmitter carrier frequency (i.e., remote oscillator) used to transmit the wireless signal. In particular, the course/fine frequency offset estimator 58 is configured for estimating the difference in the frequency between the local receiver carrier frequency and the remote receiver carrier frequency, and supplying this difference to a phasor circuit 60; the phasor circuit 60 converts the difference value to a complex phasor value (including angle information) which is supplied to the rotor circuit 56. Hence, the rotor circuit 56 rotates the adjusted signal samples based on the complex phasor value, and outputs rotated signal samples.

The circular buffer 62 is configured for buffering the rotated signal samples. In particular, the beginning of a data packet is not guaranteed to be located at the same position within the sequence of rotated signal samples. Hence, the rotated signal samples are stored in the circular buffer 62 in a manner such that any data sample within a prescribed duration (e.g., one maximum-length data packet) can be located and retrieved from the circular buffer 62. Once the circular buffer 62 reaches capacity, any new signal sample to be stored in the circular buffer 62 is overwritten over the oldest stored signal sample. Hence, the circular buffer 62 enables the receiver 50 to adjust the "starting point" of the data packet within the sequence of rotated signal samples.

The Fast Fourier Transform (FFT) circuit 64 is configured for converting the time-based sequence of rotated signal samples into a frequency domain-based series of prescribed frequency points (i.e., "tones"); according to the disclosed embodiment, the FFT circuit 64 maps the rotated signal samples to a frequency domain of fifty-two (52) available tones.

In particular, the available fifty-two (52) tones are used to transport information: four (4) tones are used as pilot tones, and the remaining forty-eight (48) tones are data tones, where each tone may carry from one to six (1-6) bits of information. According to the IEEE 802.11a/g specification, the physical layer data packet should include a short training sequence, a long training sequence, a signal field (indicating the data rate and length of the payload, and coded at the lowest data rate of 6 Mbps), and the payload data symbols encoded in one of eight data rates from 6 Mbps to 54 Mbps. The FFT circuit 64 determines the data rate from the signal field, and recovers the data tones.

The FFT circuit 64 outputs a group of tone data to a buffer 66, illustrated as a first buffer portion 66a, a second buffer portion 66b, and a switch 66c: the FFT circuit 64 alternately outputs the groups of tone data between the buffer portions 66a and 66b, enabling the switch 66 to output one group of tone data from one buffer portion (e.g., 66a) while the FFT circuit 64 is outputting the next group of tone data into the other buffer portion (e.g., 66b). Note actual implementation may utilize addressing logic to execute the functions of the switch 66c.

Since certain tones output by the FFT 64 may have encountered fading due to signal attenuation and distortion on the wireless channel, equalization is necessary to correct the fading. The frequency domain equalizer 68 is configured for reversing the fading encountered by the tones in order to provide equalized tones. Channel information is obtained by the channel estimator 70 from the long training sequence in the IEEE 802.11 preamble; the channel information is used by the channel estimator 70 to estimate the channel characteristics; the estimated channel characteristics are supplied to the frequency equalizer 68 to enable equalization of each tone.

In addition to the coarse and fine frequency offset estimator 58, the phasor circuit 60 and the channel estimator 70, the receiver module 50 also includes a timing synchronization module 72, a frequency tracking block 74, a channel tracking block 76, and a timing correction block 78 for controlling signal conditioning to ensure the received signal samples are decoded properly to accurately recover the data symbols.

The decoding portion 80 includes a digital slicer module 82, a deinterleaver 84, and a Viterbi decoder 86. The digital slicer module recovers up to 6 bits of symbol data from each tone, based on the data rate specified in the signal field in the preamble. The deinterleaver 84 performs the converse operation of the transmitter interleaver circuit, and rearranges the data back into the proper sequence of deinterleaved data. The Viterbi decoder 86 is configured for decoding the deinterleaved data into decoded data, in accordance with the IEEE 802.11 specification.

The descrambler circuit 90 is configured for recovering the original serial bit stream from the decoded data, by descrambling a 127-bit sequence generated by the scrambler of the transmitter, according to the IEEE 802.11 specification. The descrambler circuit 90 utilizes a scrambling seed, recovered from the service field of the data packet by the seed estimation circuit 92, for the descrambling operation. The signal field information from the preamble also is stored in a signal field buffer 94, configured for storing the length and data rate of the payload in the data packet. Overall control of the components of the receiver 50 is maintained by the state machine 96.

Hence, the serial bit stream recovered by the descrambler circuit 90 is output to an IEEE 802.11 compliant Media Access Controller (MAC).

Deinterleaver Having Partitioned Memory Banks

Figure 2:
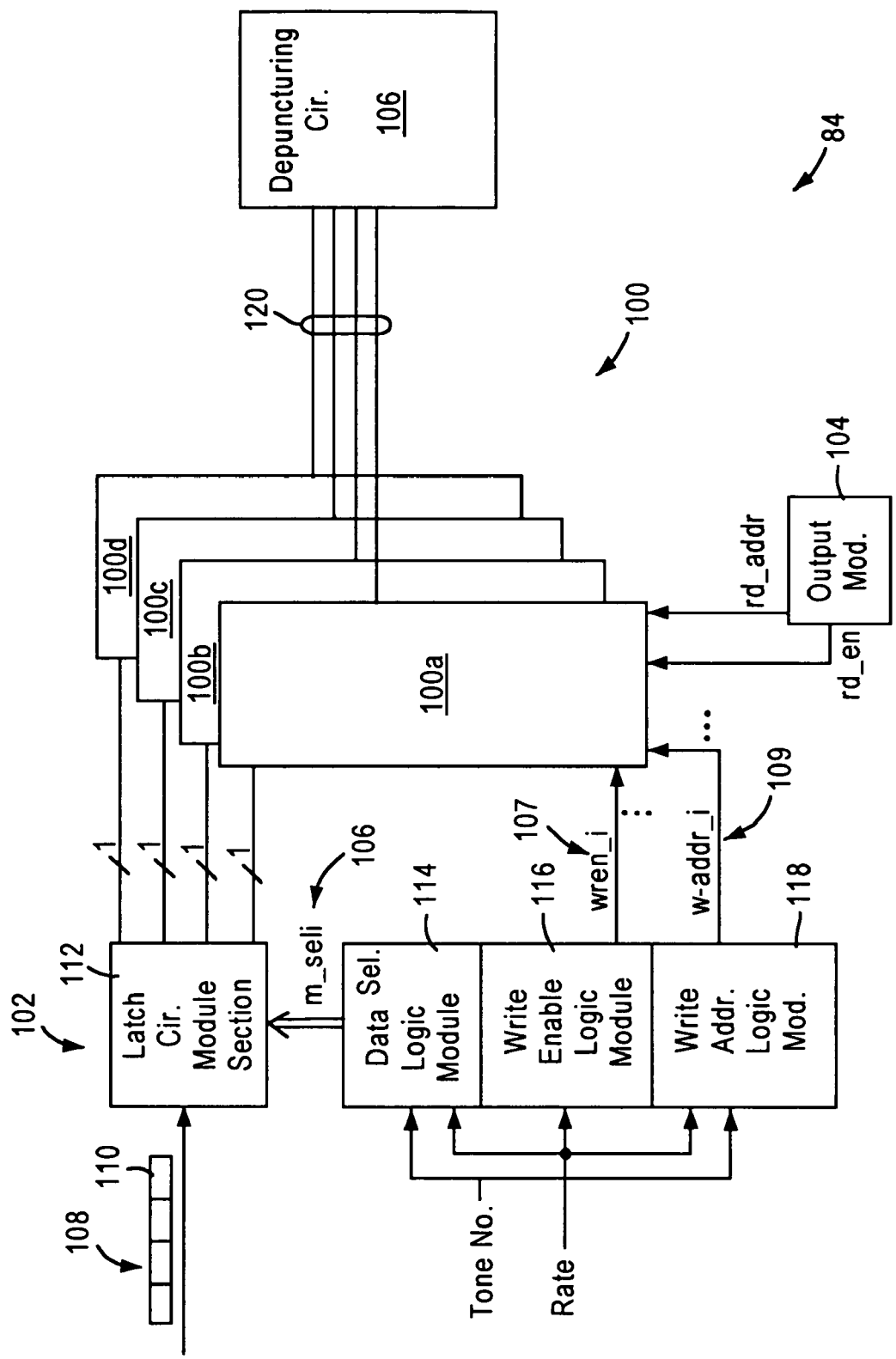
FIG. 2 is a diagram illustrating the deinterleaver of FIG. 1, according to an embodiment of the present invention.

FIG. 2 is a diagram illustrating in detail the deinterleaver module 84 of FIG. 1, according to an embodiment of the present invention. The deinterleaver module 84 includes a group of partitioned memory banks 100 (e.g., 100a, 100b, 100c, and 100d), a write logic module 102, an output module 104, and a depuncturing circuit 106.

The deinterleaver module 84 receives an input data stream 108 of interleaved data for a code word. In particular, packet data, in the form of bits, is interleaved prior to transmission for two reasons: map adjacent coded bits onto non-adjacent subcarrier frequencies (i.e., tones) to combat frequency-selective fading; and map adjacent coded bits onto alternately less and more significant bits in the constellation to combat white noise. Hence, the input data stream to the deinterleaver module 84 is composed of fragments 110 of a code word (e.g., 48-bit code word, 96-bit code word, 192-bit code word, or 288-bit code word), where each fragment is transmitted on a particular tone. Hence, collection of the fragments over the forty-eight (48) data tones enables recovery of the original code word.

The disclosed deinterleaver 84 is configured for storing the code word fragments from the interleaved data stream 108 into the partitioned memory banks 100 in a serial sequence, described below, where a group of successive code word fragments 110 are stored into the respective group of partitioned memory banks. Hence, the first group of the first, second, third, and fourth code word fragments 110 are stored in the memory banks 100a, 100b, 100c, and 100d, respectively, and the next group of the fifth, sixth, seventh, and eighth code word fragments 110 are stored in the memory banks 100a, 100b, 100c, and 100d, respectively.

The write logic module 102 includes a latch circuit module section 112, a data select logic module 114, a write enable logic module 116, and a write address logic module 118. As described below, these modules enable the code word bits for a given code word fragment 110 to be stored into the corresponding memory bank (e.g., 100a) based on the prescribed modulation and the corresponding prescribed subcarrier frequency, enabling deinterleaving operations to be performed based on writing the code word bits into the partitioned memory banks 100. Hence, the output module 104 outputs deinterleaved data 120 by retrieving, in parallel, code word bits from a given address (rd_addr) of the memory banks 100.

As described in detail below, the write logic module 102 is configured for storing, for each memory bank (e.g., 100a), code word bits for a corresponding code word fragment into respective selected locations based on the modulation in use (e.g., BPSK, QPSK, 16-QAM, or 64-QAM), and the subcarrier frequency (i.e., tone number) used for modulating the corresponding code word fragment. Bit selection is performed by the data selection logic module 114 outputting bit selection signals 106 ($m\_sel_i$), write enable for storage of data into the memory banks 100 is performed by the write enable logic module 116 outputting write enable signals 107 ($wr\_en_i$), and address selection is performed by the write address logic module 118 outputting write address signals 109 ($w\_addr_i$).

Figure 3:
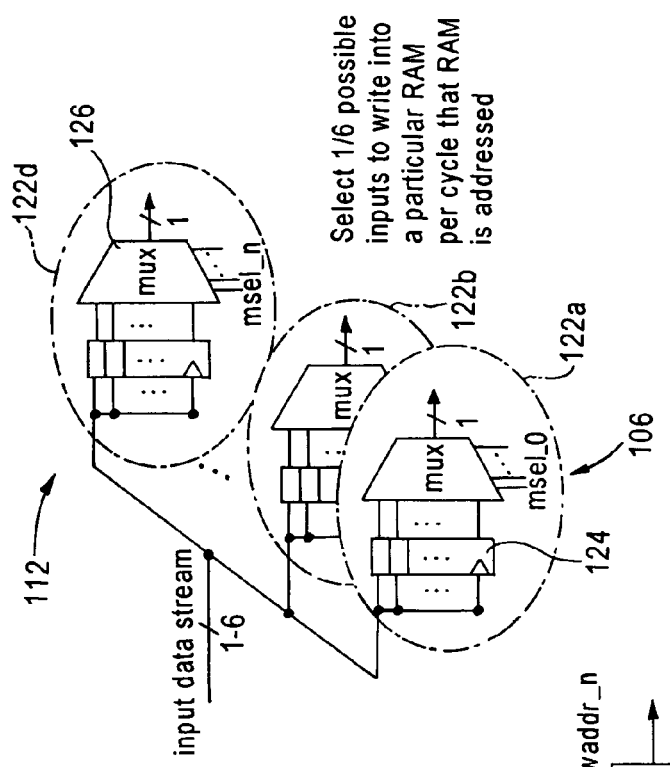
FIG. 3 is a diagram illustrating in detail the latch circuit module of FIG. 2.

FIG. 3 is a block diagram illustrating in detail the latch circuit module section 112 of FIG. 2. The latch circuit module section 112 includes latch circuit modules 122a, 122b, 122c (not shown) and 122d for each of the respective memory banks 100a, 100b, 100c, and 100d. Each latch circuit module 122 includes a six-element register 124 configured for storing each corresponding code word fragment in response to a latch signal, described below, and a multiplexer 126. The multiplexer 126 is configured for outputting a selected bit of the latched code word fragment to the corresponding memory bank (e.g., 100a) in response to a bit selection signal 106 (e.g., msel_0).

The bit selection signals (e.g., msel_0) supplied to the multiplexers 126 are generated by the data selection logic module 114. As described below with respect to FIGS. 4A-4F, the bit selection signals 106, the address signals 109, and the write enable signals 107 are generated based on applying the internal clock signal to multi-phase logic signal generators that generate the appropriate signals based on the clock signal, and the rate (i.e., the modulation type). Hence, these signals can be generated using relatively simple and logic structures having about one tenth the size compared to large addressing ROMs or look-up tables.

Figure 4A:
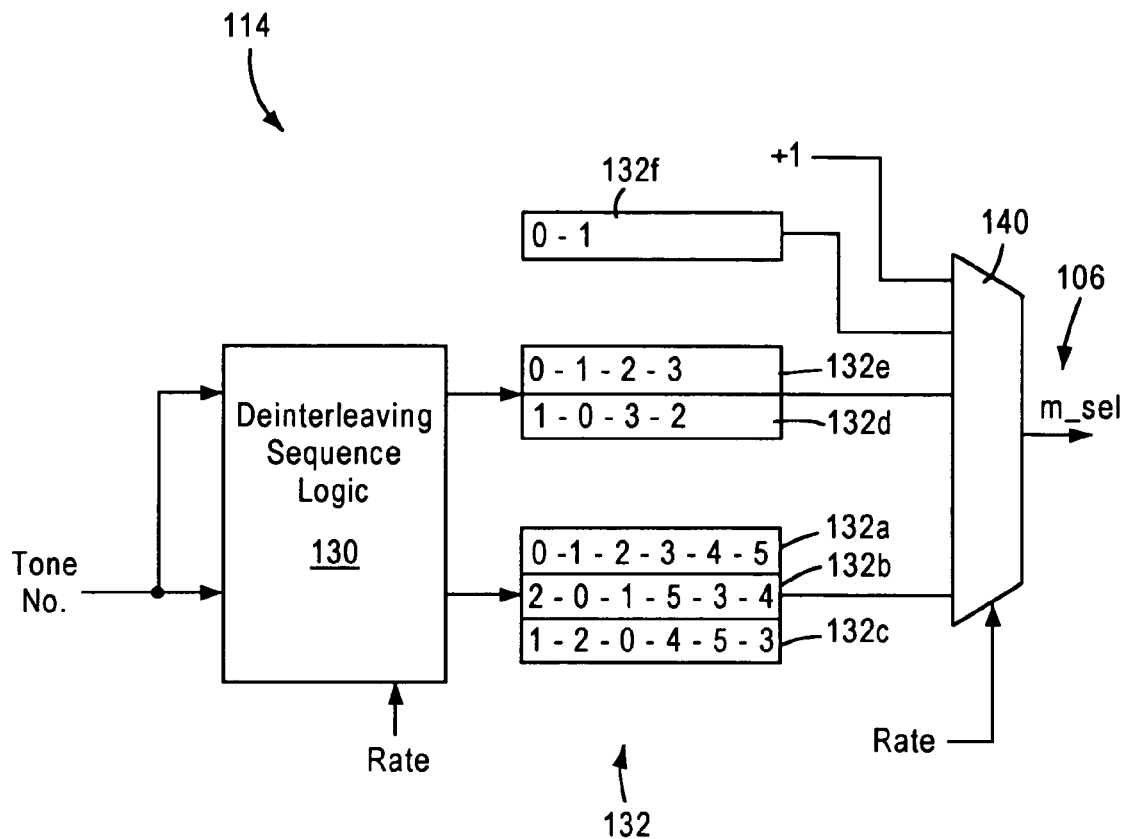
FIGS. 4A-4F are diagrams summarizing in detail the generation of the write enable signals and the bit selection signals, based on successively delayed copies of write enable signal components, by the write logic module of FIG. 2.

FIG. 4A is a simplified illustration of the data selection logic module 114. The data selection logic module 114 includes the deinterleaving sequence logic 130, configured for selecting a bit deinterleaving sequence (e.g., 132a) based (in part) on the corresponding subcarrier frequency used for the corresponding code word fragment. In particular, interleaving sequences in the transmitter are selected based on the subcarrier frequency (i.e., tone number) used for modulation, and the modulation type which determines the number of bits that are modulated in a given tone number. Hence, in the case of 64-QAM, the deinterleaving sequence logic 130 maps the identified tone to one of three available deinterleaving sequences 132a, 132b, or 132c, described below with respect to FIGS. 4D and 4E.

The multiplexer 140 is configured for outputting the deinterleaving sequence for the appropriate modulation (e.g., no sequence for BPSK, 0-1 sequence for QPSK, 0-1-2-3 or 1-0-3-2 for 16-QAM, and 0-1-2-3-4-5, 2-0-1-5-3-4, or 1-2-0-4-5-3 for 64-QAM). Other sequences also may be used. Although not illustrated in FIG. 4, the bit deinterleaving sequences are supplied successively for each clock cycle, enabling the corresponding multiplexer 126 to output the appropriate selected bit each clock cycle for storage in the corresponding memory bank (e.g., 100a). In addition, the data selection module 114 performs the selection of bit deinterleaving sequences for each of the multiplexers 126 of the latch circuit modules 122a, 122b, 122c, and 122d.

Figure 4B:
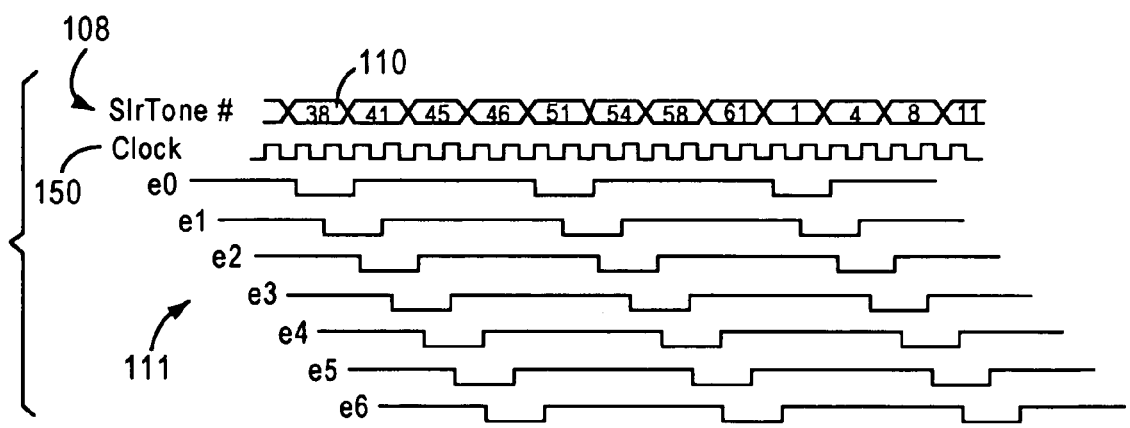

FIG. 4B is a diagram illustrating generation of successively-delayed pulsed signals 111, synchronous with the clock signal 150, that enables the modules 114, 116, and 118 to generate the appropriate signals 106, 107, and 109, respectively. In particular, the write logic module 102 includes internal logic (not shown) configured for generating the successively delayed copies of the pulsed signals 111, also referred to herein as write enable signal components (described with reference to FIG. 4C). In particular, the internal logic is implemented as a flip-flop configured for outputting a negative-pulse signal (e0) having a duration of two clock cycles, and having a period of eight (8) clock cycles; cascaded flip-flops can be utilized to generate the successively delayed copies e1, e2, e3, e4, e5, and e6.

The successively delayed pulsed signals 111 (e0-e6) are used as inputs to logic circuits within the modules 114, 116, and 118, to generate the bit selection signals 106, the write enable signals 107, and the write address signals 109, respectively. As illustrated in FIG. 4F and FIGS. 7A-7D, the logic is repeated (or shared) for each data bank 100a, 100b, 100c, 100d, enabling the tone and bit deinterleaving operations to be implemented with minimal hardware complexity, minimizing the amount of silicon area necessary for implementation.

Figure 4C:
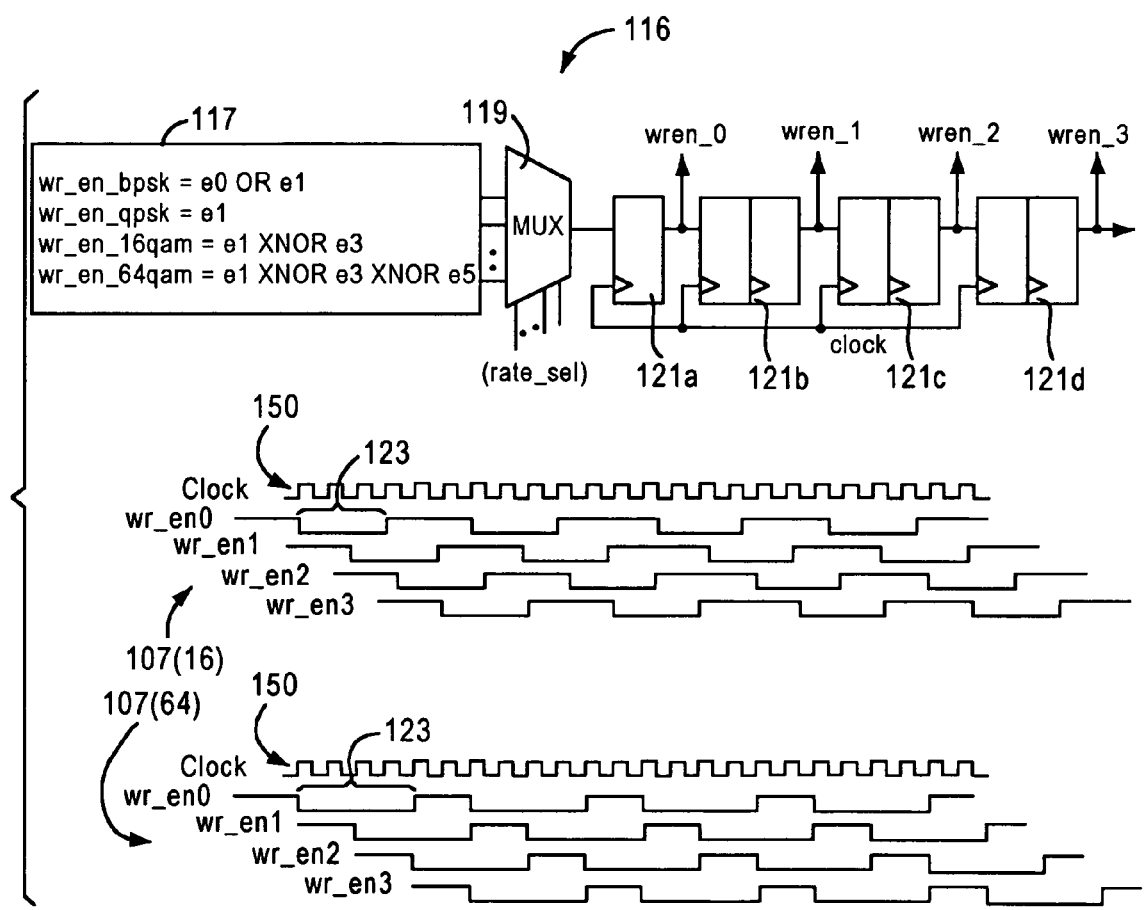

FIG. 4C is a diagram illustrating the write enable logic module 116. The write enable logic module 116, implemented as a multi-phase write enable logic generator, includes write enable logic 117 configured for outputting write enable signals for the different modulation schemes (e.g., BPSK, QPSK, 16QAM, and 64QAM). The write enable logic module 116 also includes a multiplexer 119 configured for selecting one of the write enable signals based on the modulation rate (e.g., BPSK, QPSK, 16QAM, or 64QAM), and flip-flops 121a, 121b, 121c, and 121d for generating the respective delayed copies.

As illustrated in FIG. 4C, the write enable logic 117 generates: the BPSK write enable signal (wr_en_bpsk) based on combining the e0 and e1 signals using an OR gate; the QPSK write enable signal (wr_en_qpsk) as equal to the e1 signal; the 16QAM write enable signal (wr_en_16qam) as equal to e1 XNOR e3; and the 64QAM write enable signal (wr_en_64qam) as equal to "e1 XNOR e3 XNOR e5".

Hence, the write enable signals 107 are generated based on applying logic operations to the pulsed signals 111, which serve as components of the write enable signals. As such, the pulsed signals are also referred to as write enable signal components. FIG. 4C illustrates generation by the write enable logic module 116 of the write enable signals 107(16) for 16QAM modulation, and write enable signals 107(64) for 64QAM modulation. Hence, the write enable logic module 116 generates the write enable signals 107 (wr_en0, wr_en1, wr_en2, and wr_en3) as successively delayed copies to the respective memory banks 100a, 100b, 100c, and 100d, having an enable duration 123 (e.g., 1 clock cycle for BPSK, 2 clock cycles for QPSK, 3 clock cycles for 16QAM, 4 clock cycles for 64QAM) that varies relative to the number of code word bits in the code word fragment.

Figure 4D:
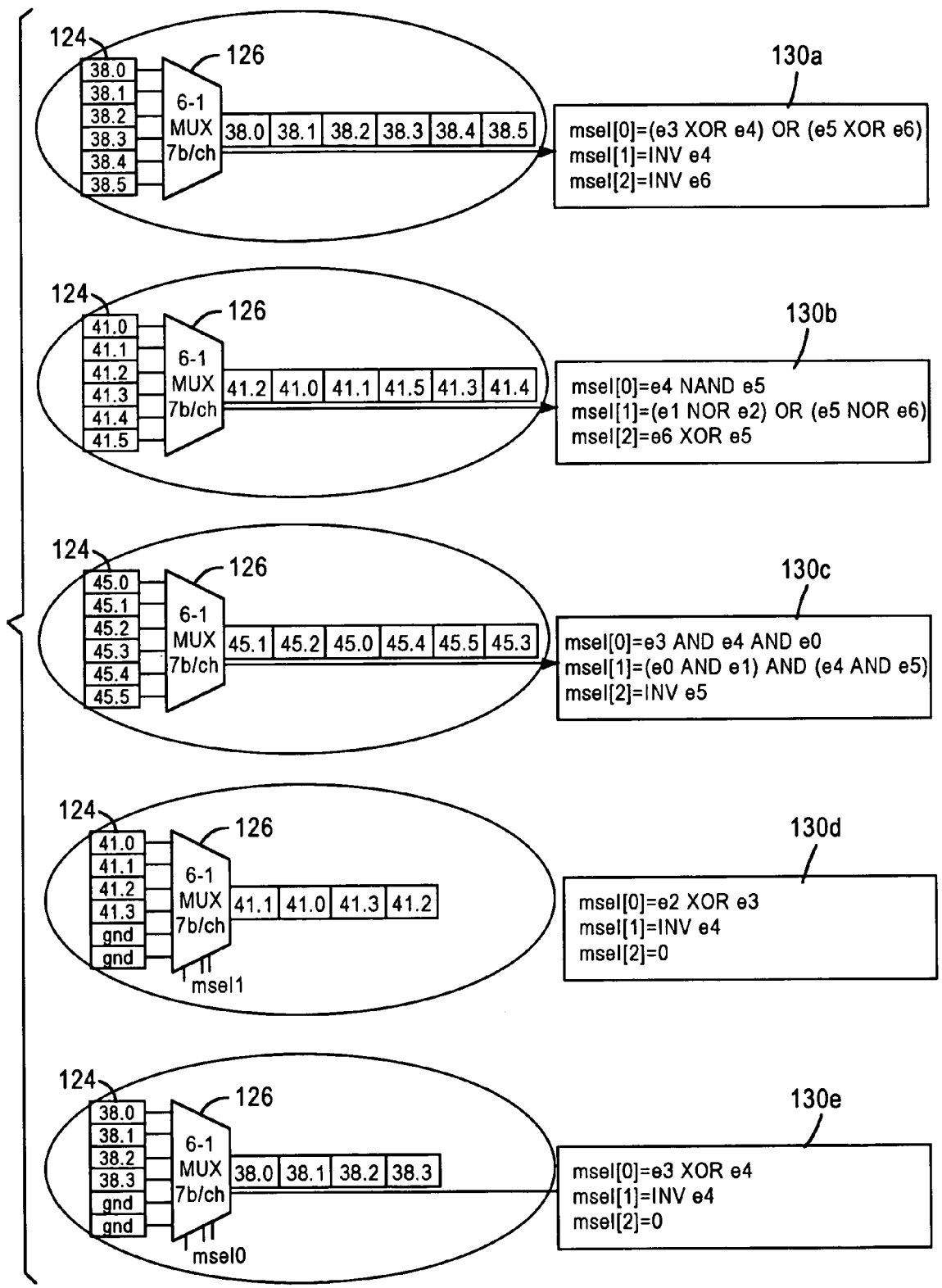
Figure 4E:
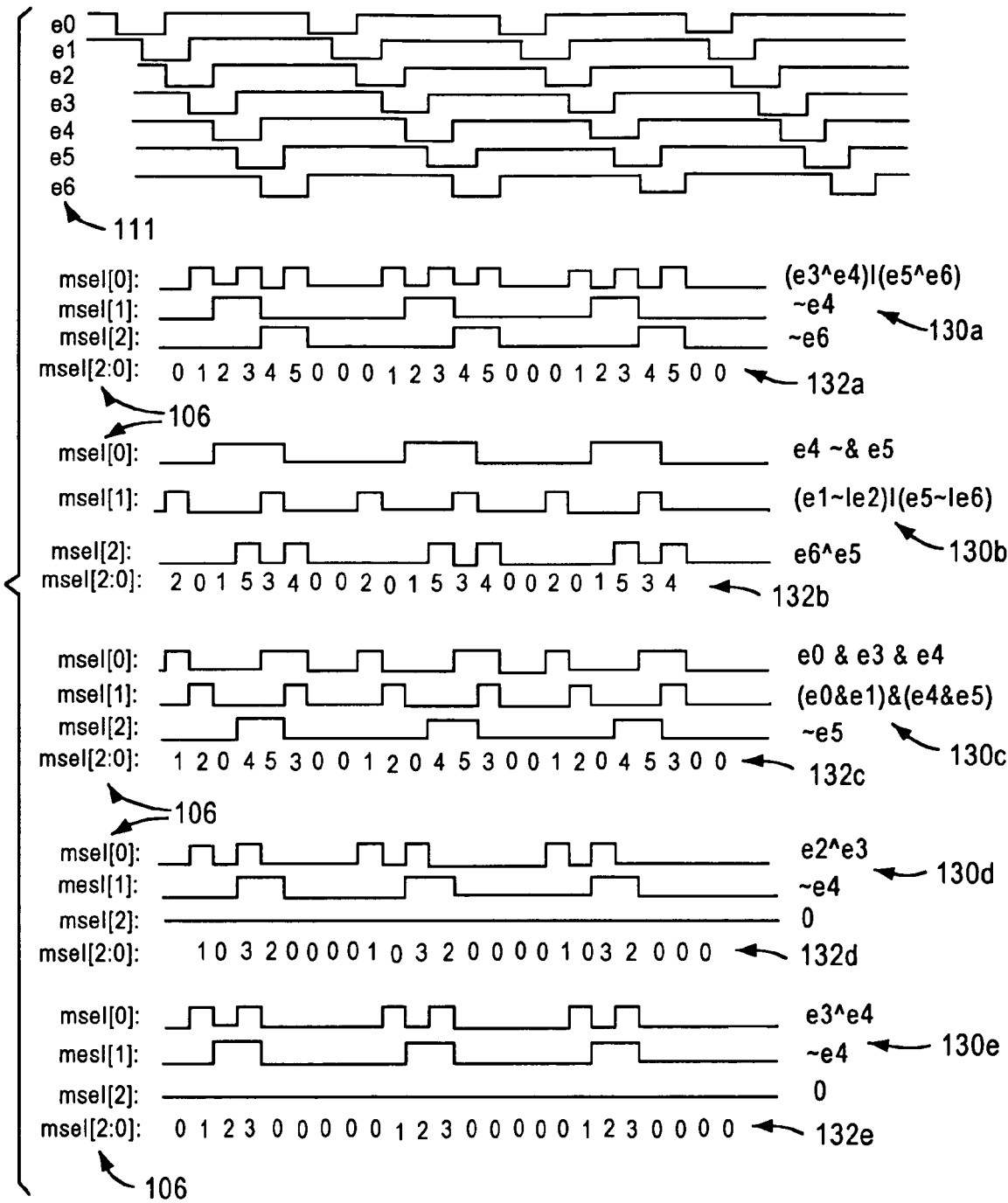

FIG. 4D is a diagram illustrating in further detail the data selection logic module 130 of FIG. 4A. In particular, the data selection logic module 130 includes multi-phase logic circuits 130, 130b, 130c, 130d, 130e for generation of the bit deinterleaving sequences 132a, 132b, 132c, 132d, and 132e, respectively. As illustrated in detail in FIG. 4E, the write enable component signals (e0-e6) 111 are applied to the multi-phase logic circuits to generate a 3-bit value msel[2:0] 106 that varies in value over time based on the write-enable component signals 111. The multiple outputs by the multi-phase logic circuits enables the multiplexer 140 to select one of the sequences based on the rate (i.e., modulation) being used (e.g., BPSK, QPSK, 16QAM, or 64QAM).

Figure 4F:
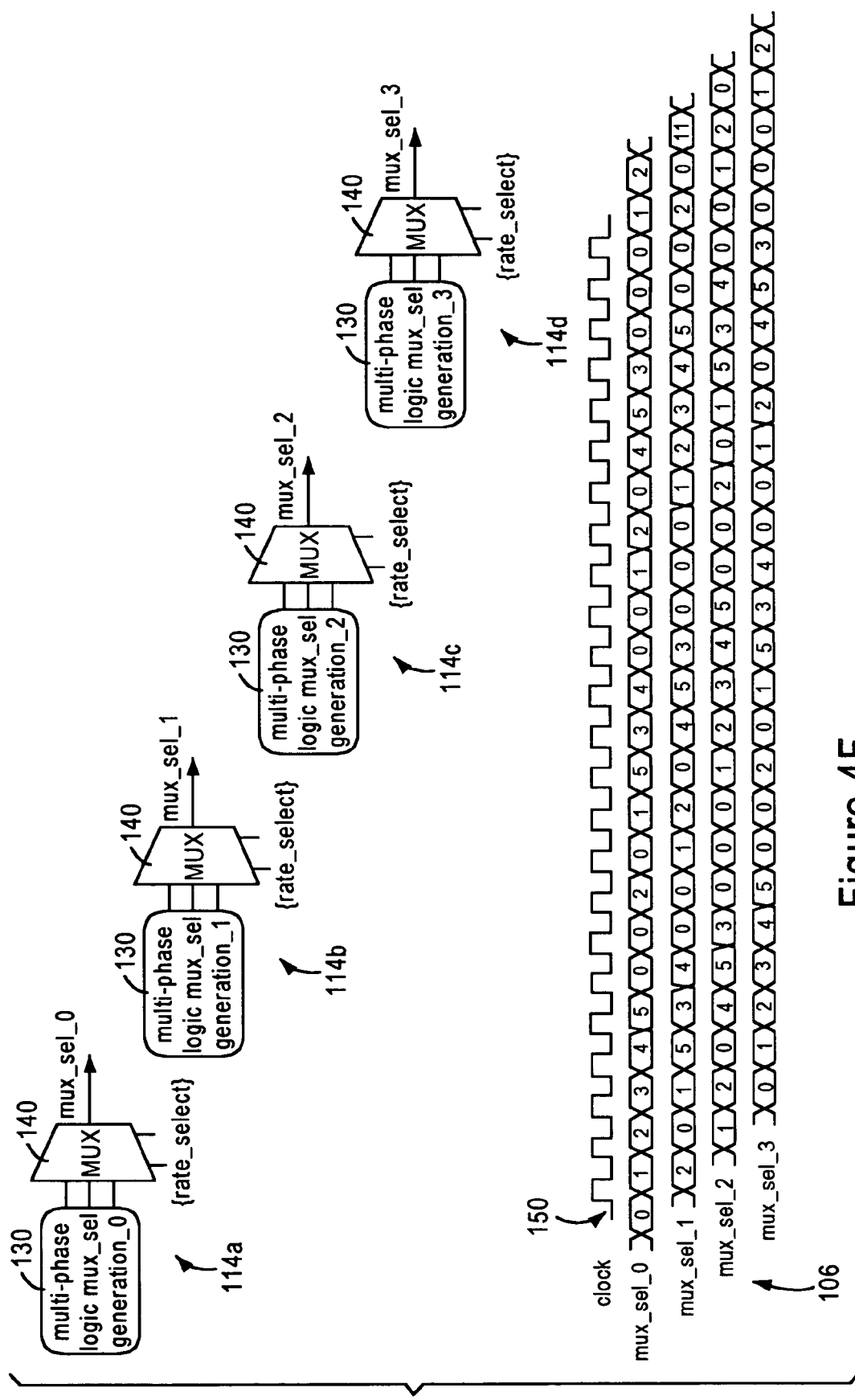

As illustrated in FIG. 4F, the bit selection module 114 is repeated (114a, 114b, 114c, and 114d) for each of the latch circuit modules 122a, 122b, 122c, and 122d supplying data to the respective memory banks 100a, 100b, 100c, and 100d. Hence, the multi-phase bit deinterleaving can be implemented with minimal complexity.

Figure 5:
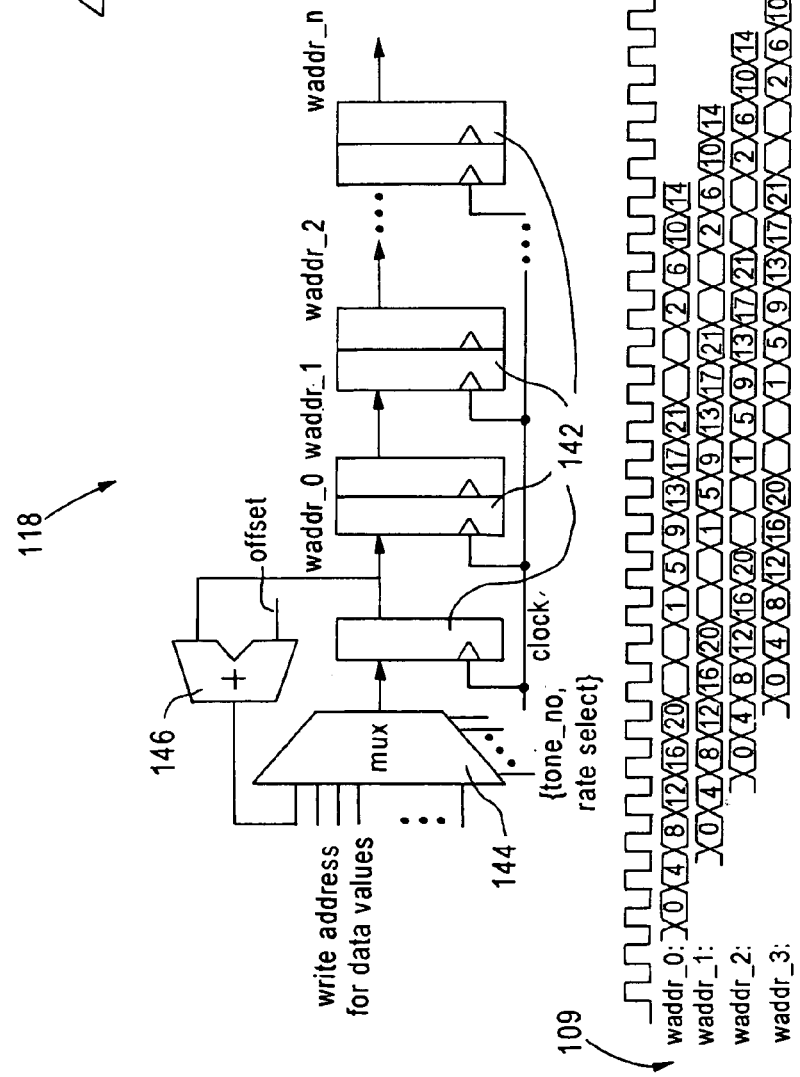
FIG. 5 is a diagram summarizing operation of the write address logic module of FIG. 2.

FIG. 5 is a diagram illustrating the write address logic module 118 of FIG. 2. The write address logic module 118 is configured for selecting, for each code word fragment, the respective addresses for storage of the code word bits based on the modulation, the subcarrier frequency, and a prescribed offset relative to each successive group of successive code word fragments. In particular, the write address logic module 118 includes latches 142 that enable a generated address value to be cascaded (i.e., linear shifted) across the respective memory banks 100. Hence, a given address (e.g., waddr_i=0) will first be supplied to the memory bank 100a (waddr_0=0) for the first code word bit to be stored; after two clock cycles the address will be supplied to the next memory bank 100b (waddr_$_{-1}$=0) for the corresponding first code word bit to be stored, etc., enabling the memory banks to share addressing logic. The next address (waddr_0=4) for the next code word bit to be stored is then propagated the next clock cycle.

The write address logic module 118 also includes multiplexer based logic 144, and an adder 146. The adder 146 is used to add a prescribed offset to each code word bit that needs to be stored in the memory bank; as illustrated in FIG. 5, the offset value is set to a value of "offset=4". As illustrated in FIG. 5, the six (6) code word bits for each code word fragment in the first group supplied to the memory banks 100a, 100b, 100c, and 100d are stored at address 0, 4, 8, 12, 16, and 20 (assuming 64-QAM).

Once the first group of code word fragments has been stored, the multiplexer logic 144 selects the next group of available addresses (e.g., "1") for storage of the next group of code word fragments.

Figure 6:
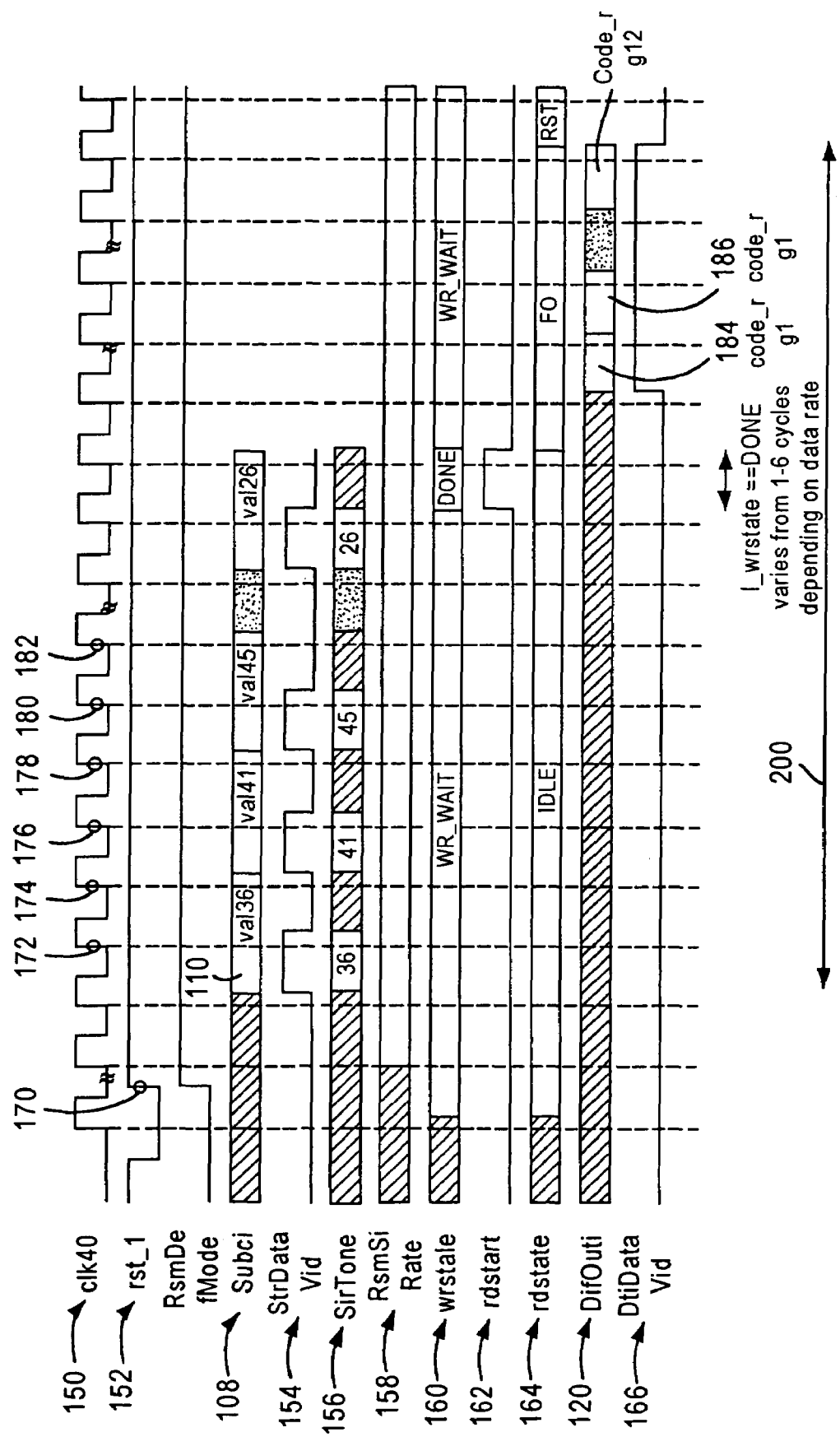
FIG. 6 is a timing diagram illustrating the writing of interleaved data, and reading of deinterleaved data, by the deinterleaver module of FIG. 2, according to an embodiment of the present invention.

FIG. 6 is a timing diagram illustrating the writing of interleaved data 108 into the memory banks 100, and the reading of the interleaved data 120, according to an embodiment of the present invention. FIG. 6 illustrates a clock signal 150, a reset signal 152, the incoming stream 108 of code word fragments 110, a data valid strobe 154, a tone identifier 156 that specifies the corresponding subcarrier frequency for the corresponding code word fragment 110, a modulation rate identifier 158, the write state status signal 160, a read start signal 162, a read state status signal 164, output data 120, and an output data valid strobe 166.

FIGS. 7A, 7B, 7C, and 7D illustrate storage of code word fragments according to BPSK (1-bit) modulation, QPSK (2-bit) modulation, 16-QAM (4-bit) modulation, and 64-QAM (6-bit) modulation, respectively. Each of the FIGS. 7A, 7B, 7C and 7D store the sequence 108 of code word fragments corresponding to the forty-eight (48) data tones according to the sequence 38, 41, 45, 48, 51, 54, 58, 61, 1, 4, 8, 11, 14, 17, 20, 24, 39, 42, 46, 49, . . . 3, 6, 10, 13, 16, 19, 23, 26.

Figure 7A:
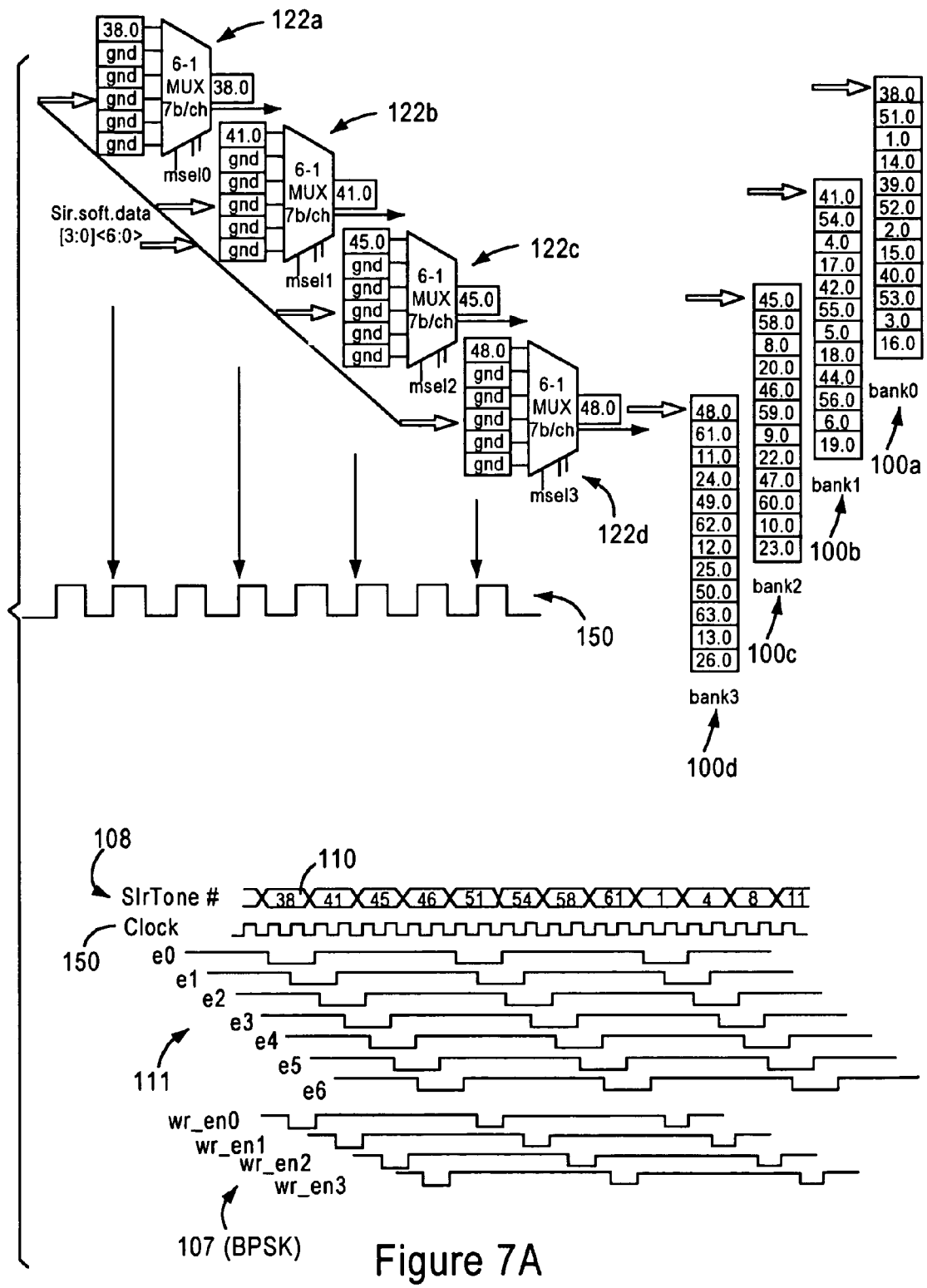
FIGS. 7A, 7B, 7C, and 7D are diagrams illustrating storage of code word bits within the partitioned memory banks of FIG. 2, according to binary phase shift keying modulation, quadrature phase shift keying modulation, 16-QAM modulation, and 64-QAM modulation, respectively, according to an embodiment of the present invention.

Referring to FIG. 6, the latch circuit 122a latches the first code word fragment 110 (val38), following the reset signal at event 170, at the rising clock edge of event 172 based on a latch signal (not shown). The tone number value 156 is supplied to the data selection logic module 114 and the write address logic module 118, enabling identification of the appropriate deinterleaving sequence 132 of FIG. 4. In addition, the modulation rate 158 specifies the modulation type (e.g., 6 Mbps corresponds to BPSK). Assuming for simplicity that BPSK is used, the code word fragments 110 are stored in the memory banks 100 as illustrated in FIG. 7A. Hence, since only a single bit is represented in a BPSK-modulated code word fragment 110, the multiplexer 144 of the write address logic module 118 supplies the write addresses in contiguous sequence. The output module 104 within output in parallel the 4-bit outputs 120 starting at event 184.

Figure 7B:
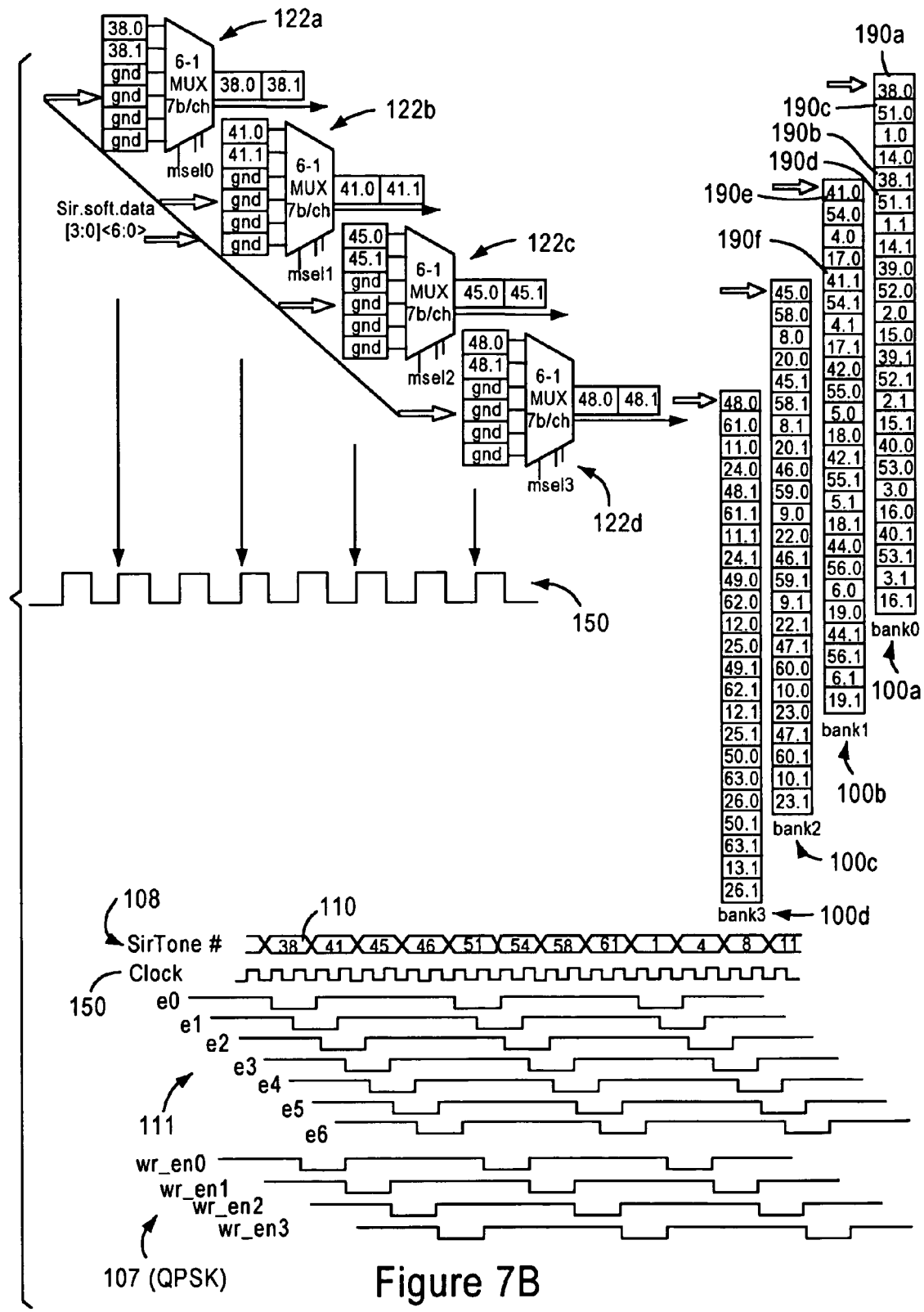

In the case of QPSK, illustrated in FIG. 7B, the data selection logic module 114 generates selection signals for the multiplexers 126 to supply the code word bits 190 according to the sequence 0, 1, 0, 1, etc. The write address logic module 118 supplies the write address for writing each code word bit 190. Hence, at event 172 the latch circuit module 122a would store the code word bit 190a in the memory bank 100a at address "0"; at event 174 the latch circuit module 122a would store the code word bit 190b in the memory bank 100a at address "4".

At event 176 the code word fragment 108 for the next subcarrier frequency "41" would be latched into the latch circuit module 122b, and the code word bit 190e (41.0) would be written into the memory bank 100b at address "0", followed by the storage at event 178 of the next code word bit 190f into the memory bank 100b at address "4".

After the first group of code word fragments for tones 38, 41, 45, and 48 have been stored, the write address logic module 118 increments the address pointer for storage of the code word bits (e.g., 190c and 190d) for the next code word fragment at addresses "1" and "5", respectively. The storage sequence continues until the last code word fragment is stored corresponding to tone 26.

Figure 7C:
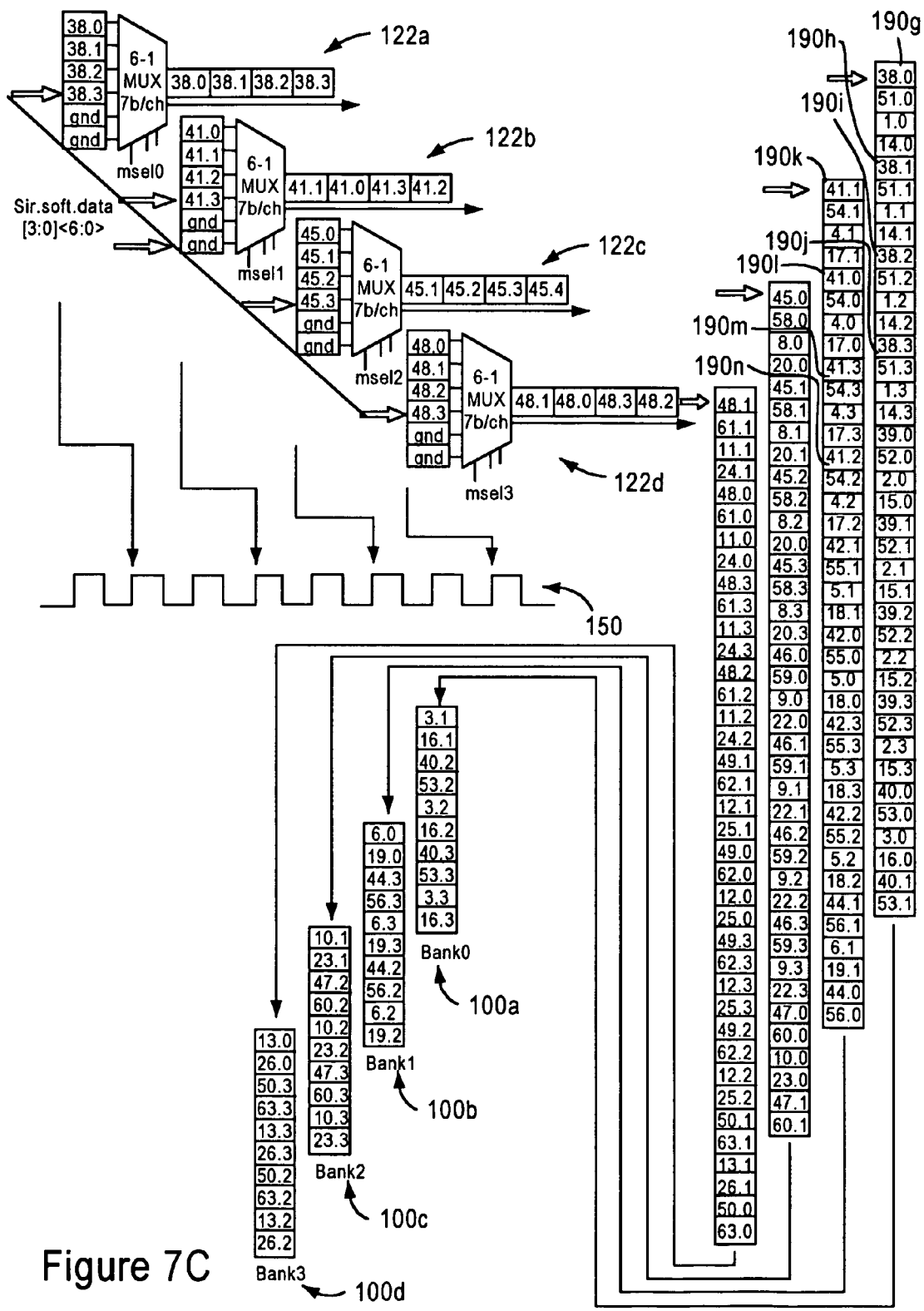

FIG. 7C illustrates storage of the 4-bit 16-QAM modulated code word fragments 110. The corresponding write enable sequence 107(16) is illustrated in FIG. 4C. The code word bits 190g, 190h, 190i, and 190j for the code word fragment 110 corresponding to tone 38 are stored at events 172, 174, 176, and 178 at addresses "0", "4", "8", and "c" (hexadecimal), respectively. The code word bits 190k, 190l, 190m, and 190n for the code word fragment 110 corresponding to tone 41 are stored at events 176, 178, 180, and 182 at addresses "0", "4", "8", and "c" (hexadecimal), respectively.

Note that the code word bits 190g, 190h, 190i, and 190j for the code word fragment 110 corresponding to tone 38 are written according to the bit deinterleaving sequence 132e ("0-1-2-3"), whereas the code word bits 190k, 190l, 190m, and 190n for the code word fragment 110 corresponding to tone 41 are written according to the bit deinterleaving sequence 132e ("1-0-3-2"). As described above, the bit deinterleaving sequence may be selected for the corresponding modulation rate based on the tone number, where each tone number maps to one of a prescribed group of deinterleaving sequences 132 via the deinterleaving sequence logic 130. Hence, the first four-bit output value 120 at event 184 would include the bits "38.0, 41.1, 45.0, and 48.1", followed by the next four-bit output value at event 186 including the bits "51.0, 54.1, 58.0, 61.1".

Figure 7D:
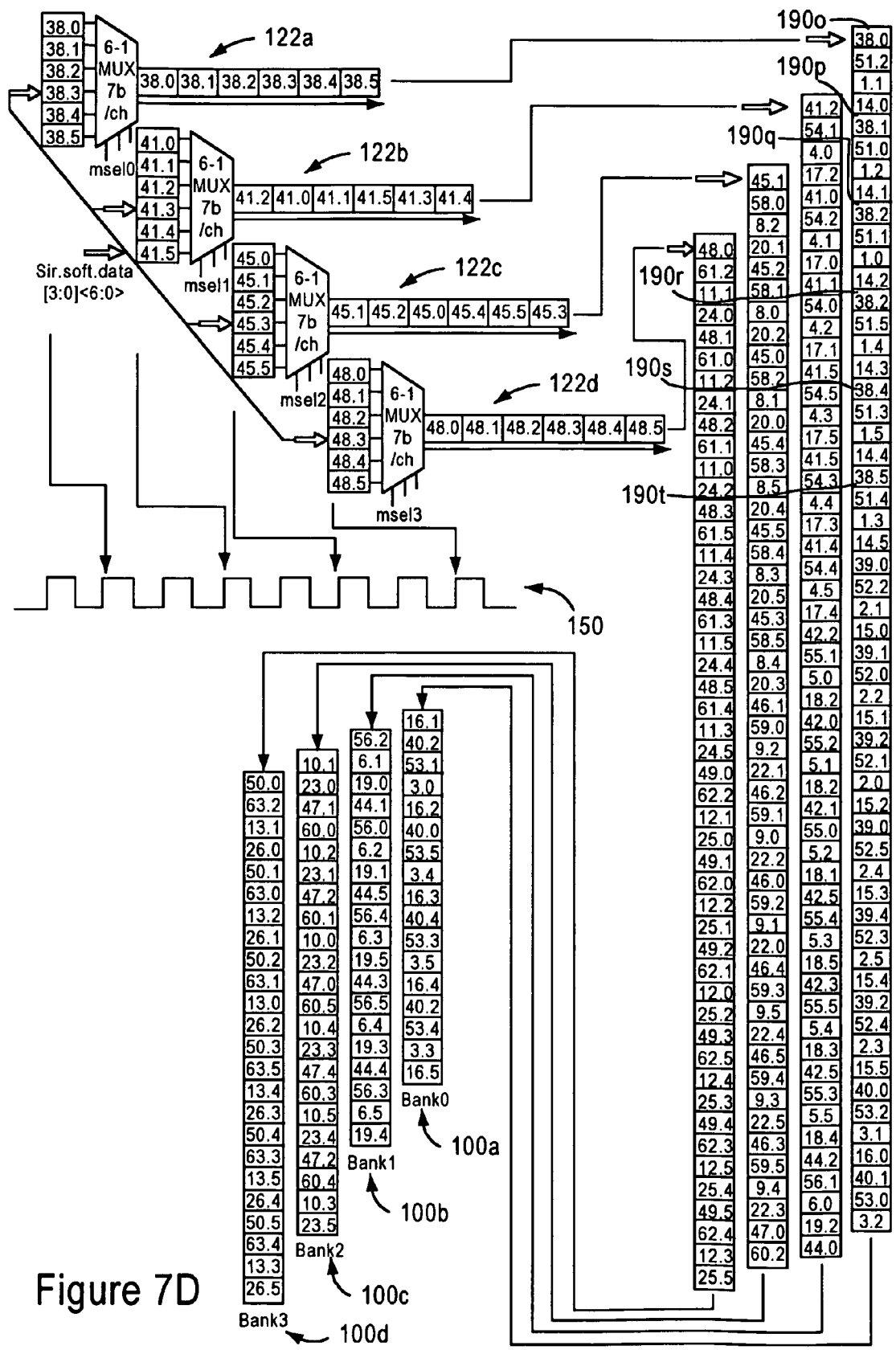

FIG. 7D illustrates storage of the 6-bit 64-QAM modulated code word fragments 110. The corresponding write enable sequence 107(64) is illustrated in FIG. 4C. In particular, the code word bits 190o, 190p, 190q, 190r, 190s, and 190t for the code word fragment 110 corresponding to tone 38 are stored at events 172, 174, 176, 178, 180, and 182 at addresses "0", "4", "8", "c", "10", and "14" (hexadecimal), respectively. The code word bits for the code word fragments 110 corresponding to tones 41, 45, and 48 also are stored at addresses "0", "4", "8", "c", "10", and "14" (hexadecimal).

Note, however, that whereas the code word bits for the code word fragments 110 corresponding to tones 38 and 48 are stored according to the sequence 132a ("0-1-2-3-4-5"), the code word bits for the code word fragments 110 corresponding to tones 41 and 45 are stored according to the sequence 132b ("2-0-1-5-34") and 132c ("1-2-0-4-5-3"), respectively. Hence, while the same addressing scheme is used for the group of code word fragments for the first four tones 38, 41, 45, and 48, different deinterleaving sequences 132 are selected for the latch circuit modules 122 based on the tone number for the given modulation scheme. As described above, the bit deinterleaving sequence is selected for the corresponding modulation rate based on the tone number, where each tone number maps to one of a prescribed group of deinterleaving sequences (e.g., 132*a*, 132*b*, or 132*c*) via the deinterleaving sequence logic 130. Hence, the first four-bit output value 120 at event 184 would include the bits "38.0, 41.2, 45.1, and 48.0", followed by the next four-bit output value at event 186 including the bits "51.2, 54.1, 58.0, 61.2".

In addition, address selection for each successive group of code word fragments is controlled by the address selection logic 144 of FIG. 5 (note address values in FIG. 5 are decimal), enabling the write address logic module 118 to select addresses based on the modulation scheme and the tone number.

According to the disclosed embodiment, a multiple memory bank architecture enables data to be deinterleaved based on the writing of the code word fragments into memory, enabling addressing and deinterleaving logic to be implemented in a flexible manner that enables the deinterleaver module 84 to provide flexibility in deinterleaving different modulation rate data streams within the same architecture. Further, the serial input/parallel output scheme minimizes latency in the deinterleaving process, enabling the deinterleaved data to be output as soon as the first row of data has been stored. Moreover, total operation latency is reduced to less than one OFDM symbol length (160 clock cycles at 40 MHz) based on the overlapping of write and read operations, and cascaded bit deinterleaving. Hence, the output module 104 is configured for outputting the deinterleaved data for an entire code word, from the memory banks 100, within one OFDM symbol time 200 of reception of the interleaved data by the deinterleaver module.

While this invention has been described with what is presently considered to be the most practical preferred embodiment, it is to be understood that the invention is not limited to the disclosed embodiments, but, on the contrary, is intended to cover various modifications and equivalent arrangements included within the spirit and scope of the appended claims.

What is claimed is:

1. A method in a deinterleaver module for deinterleaving interleaved data into deinterleaved data, the method including:
    generating a write enable signal for writing a code word fragment into one of a group of partitioned memory banks, the write enable signal having a period based on a prescribed maximum number of code word bits for the code word fragment relative to a prescribed clock, and an enable duration having a number of clock cycles corresponding to a prescribed number of the code word bits in the code word fragment based on a prescribed modulation of the interleaved data;
    generating an address signal based on the prescribed modulation and a selected offset, including selectively incrementing, based on the prescribed modulation, the address signal by the selected offset each clock signal concurrent with the enable duration;
    generating successively delayed copies of the write enable signal and the address signal for others of the group of partitioned memory banks; and
    storing a first group of the code word fragments into the respective group of partitioned memory banks, by supplying to the respective partitioned memory banks the address and write enable signals and the successively delayed copies thereof, wherein:
    (1) each code word fragment is associated with a corresponding prescribed subcarrier frequency and has the prescribed number of code word bits, and
    (2) the storing includes writing the code word bits for each code word fragment into respective selected locations of the corresponding memory bank based on the corresponding address signal and the corresponding write enable signal.

2. The method of claim 1, wherein the storing further includes:
    storing each code word fragment at a corresponding first clock edge; and
    successively writing the code word bits for the corresponding code word fragment at respective successive clock edges following the corresponding first clock edge.

3. The method of claim 2, wherein the successively writing includes writing the code word bits into the respective selected locations according to a selected bit deinterleaving sequence.

4. The method of claim 3, wherein the storing further includes selecting, for each of the memory banks, a corresponding one of a plurality of bit deinterleaving sequences for the corresponding code word fragment based on the prescribed modulation and the corresponding prescribed subcarrier frequency.

5. The method of claim 3, further including storing a second group of the successive code word fragments from the interleaved data into the respective memory banks by:
    (1) selecting, for each memory bank, a second bit deinterleaving sequence based on the corresponding prescribed subcarrier frequency for the corresponding code word fragment; and
    (2) successively writing, for each memory bank, the code word bits for the corresponding code word fragment at respective selected locations according to the second bit deinterleaving sequence and a prescribed offset relative to the first group.

6. The method of claim 3, wherein the storing step includes generating a plurality of the bit deinterleaving sequences, including the selected bit deinterleaving sequence, based on applying at least a selected portion of the successively delayed copies of a component of the write enable signal to a deinterleaving sequence logic circuit.

7. The method of claim 1, further including repeating the outputting step for successive addresses for outputting of an entire code word, from the memory banks, within one OFDM symbol time of reception of the interleaved data by the deinterleaver module.

8. A deinterleaver module including:
    a group of partitioned memory banks configured for storing interleaved data as a respective group of successive code word fragments, each code word fragment associated with a prescribed subcarrier frequency and having a prescribed number of code word bits based on a prescribed modulation of the interleaved data, each memory bank configured for storing a selected bit of a corresponding received code word fragment at a corresponding selected location;
    a write logic module configured for storing, for each memory bank, the code word bits for each corresponding code word fragment into the respective selected locations based on the prescribed modulation and the corresponding prescribed subcarrier frequency, the write logic module including:
    (1) a data selection logic module configured for generating bit selection signals for storage of the code word bits according to selected bit deinterleaving sequences, based on at least selected ones of a plurality of successively delayed copies of a write enable signal component, (2) a multi-phase write enable logic generator configured for generating the successively delayed copies of the write enable signal, the write enable signal having a period based on a prescribed maximum number of code word bits for the code word fragment relative to a prescribed clock and an enable duration having a number of clock cycles corresponding to a prescribed number of the code word bits in the code word fragment based on a prescribed modulation of the interleaved data; and an output module configured for outputting deinterleaved data from the partitioned memory banks by retrieving, in parallel, code word bits stored at a corresponding selected address for the memory banks.

9. The deinterleaver module of claim 8, wherein the write logic module further includes latch circuit modules for each of the memory banks, each latch circuit module configured for storing each corresponding code word fragment at a corresponding first clock edge, and successively writing the code word bits for the corresponding code word fragment at respective successive clock edges following the corresponding first clock edge, based on the bit selection signals.

10. The deinterleaver module of claim 9, wherein the data selection logic module includes, for each of the latch circuit modules, a bit selection module having a multi-phase logic circuit for generating the bit sequences, and a multiplexer configured for selecting the corresponding selected bit selection signals based on the prescribed modulation.

11. The deinterleaver module of claim 9, wherein the write logic module further includes a write address logic module configured for selecting, for each code word fragment, the respective selected locations for storage of the code word bits, based on the prescribed modulation, the corresponding prescribed subcarrier frequency, and a prescribed offset relative to each successive group of successive code word fragments.

12. The deinterleaver of claim 8, wherein the output module is configured for outputting the deinterleaved data for an entire code word, from the memory banks, within one OFDM symbol time of reception of the interleaved data by the deinterleaver module.

13. A method in a deinterleaver module for deinterleaving interleaved data, having code word fragments of a prescribed number of code word bits, the method including:

first generating a periodic pulse signal, the periodic pulse signal having a period based on a prescribed maximum number of code word bits for a received code word fragment relative to a prescribed clock, the periodic pulse signal further including a pulse duration having a number of clock cycles corresponding to the prescribed number of the code word bits in the code word fragment based on a prescribed modulation of the interleaved data;

second generating, based on the periodic pulse signal and a prescribed number of successively delayed copies thereof applied to prescribed write logic, a write enable signal, bit deinterleaving sequence selection signals and address values for each of the prescribed number of code word bits for each code word fragment;

writing each of the code word bits for each code word fragment to a deinterleaver memory bank according to the corresponding address value and bit deinterleaving sequence selection signal, according to the write enable signal; and outputting deinterleaved data by retrieving the stored code word bits from the deinterleaver memory according to a prescribed contiguous sequence.

14. The method of claim 13, wherein the deinterleaver module includes additional memory banks, wherein the second generating step includes:

(1) generating successively delayed copies of the write enable signal, and the address values for the additional memory banks, and (2) generating the bit deinterleaving sequence selection signals based on the prescribed modulation and a corresponding prescribed subcarrier frequency for the corresponding code word fragment;

the writing step including writing each code word fragment in a corresponding one of the memory banks according to the corresponding write enable signal, the corresponding address value and the corresponding bit deinterleaving sequence.

15. The method of claim 14, wherein the step of generating successively delayed copies of the write enable signal and the address values includes phase-shifting the write enable signal and the address values by two clock cycles.

* * * * *